(12) United States Patent
Minegishi et al.

(10) Patent No.: US 9,718,950 B2
(45) Date of Patent: Aug. 1, 2017

(54) DIRECTED SELF-ASSEMBLY COMPOSITION FOR PATTERN FORMATION AND PATTERN-FORMING METHOD

(71) Applicant: JSR CORPORATION, Tokyo (JP)

(72) Inventors: Shinya Minegishi, Tokyo (JP); Yuji Namie, Tokyo (JP); Tomoki Nagai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 439 days.

(21) Appl. No.: 13/923,176

(22) Filed: Jun. 20, 2013

(65) Prior Publication Data

US 2013/0344249 A1    Dec. 26, 2013

(30) Foreign Application Priority Data

Jun. 21, 2012  (JP) .................. 2012-140124

(51) Int. Cl.
| | |
|---|---|
| *C08L 25/06* | (2006.01) |
| *C09D 133/08* | (2006.01) |
| *C08L 33/14* | (2006.01) |
| *B05D 5/00* | (2006.01) |
| *G03F 7/00* | (2006.01) |
| *C09D 133/06* | (2006.01) |
| *C09D 133/16* | (2006.01) |
| *C08L 33/16* | (2006.01) |

(52) U.S. Cl.
CPC ............... *C08L 25/06* (2013.01); *B05D 5/00* (2013.01); *C08L 33/14* (2013.01); *C09D 133/066* (2013.01); *C09D 133/08* (2013.01); *C09D 133/16* (2013.01); *G03F 7/0002* (2013.01); *C08L 33/16* (2013.01)

(58) Field of Classification Search
CPC .................................. C08L 25/06; C08L 33/14
See application file for complete search history.

(56) References Cited

U.S. PATENT DOCUMENTS

| | | | | |
|---|---|---|---|---|
| 4,722,883 A | * | 2/1988 | Koibuchi | G03F 7/008 430/197 |
| 5,981,313 A | * | 11/1999 | Tanaka | H01L 21/563 257/788 |
| 6,565,763 B1 | * | 5/2003 | Asakawa | B82Y 10/00 216/22 |

(Continued)

FOREIGN PATENT DOCUMENTS

| | | | |
|---|---|---|---|
| CH | EP 1400850 A1 * | 3/2004 | ........... G03F 7/0233 |
| JP | 2002-519728 | 7/2002 | |

(Continued)

OTHER PUBLICATIONS

WO2010131680 translation retreived from espacenet.com.*
Office Action issued Jul. 14, 2015 in Japanese patent Application No. 2012-140124 (with English translation).

*Primary Examiner* — Cachet Sellman
(74) *Attorney, Agent, or Firm* — Oblon, McClelland, Maier & Neustadt, L.L.P.

(57) ABSTRACT

A directed self-assembly composition for pattern formation, includes two or more kinds of polymers. The two or more kinds of polymers each do not have a silicon atom in a main chain thereof. At least one of the two or more kinds of polymers has a group binding to the polymerizing end of the main chain and having a hetero atom.

18 Claims, 3 Drawing Sheets

(56) References Cited

U.S. PATENT DOCUMENTS

| | | | |
|---|---|---|---|
| 2001/0014431 A1* | 8/2001 | Nitta | G03F 7/38 430/326 |
| 2001/0024684 A1 | 9/2001 | Steiner et al. | |
| 2003/0173568 A1* | 9/2003 | Asakawa | H01L 33/22 257/79 |
| 2005/0271428 A1* | 12/2005 | Yaguchi | G03G 15/09 399/282 |
| 2009/0042146 A1* | 2/2009 | Kim | B81C 1/00031 430/323 |
| 2009/0155725 A1* | 6/2009 | Yi | H01L 21/0276 430/312 |
| 2009/0200646 A1* | 8/2009 | Millward | B81C 1/00031 257/632 |
| 2009/0214823 A1* | 8/2009 | Cheng | B81C 1/00031 428/137 |
| 2009/0214976 A1* | 8/2009 | Teshima | G03G 9/12 430/115 |
| 2012/0116007 A1* | 5/2012 | Gopalan | C08F 293/005 524/529 |
| 2013/0240481 A1* | 9/2013 | Senzaki | C08L 53/00 216/49 |

FOREIGN PATENT DOCUMENTS

| | | | | |
|---|---|---|---|---|
| JP | 2003-218383 | 7/2003 | | |
| JP | 2008-149447 | 7/2008 | | |
| JP | 2008-266469 | 11/2008 | | |
| JP | 2010-58403 | 3/2010 | | |
| JP | WO 2010131680 A1 * | 11/2010 | | C08L 33/06 |
| JP | 2012-51958 | 3/2012 | | |
| WO | WO 2010/131680 A1 | 11/2010 | | |

* cited by examiner

DIRECTED SELF-ASSEMBLY COMPOSITION FOR PATTERN FORMATION AND PATTERN-FORMING METHOD

CROSS-REFERENCE TO RELATED APPLICATIONS

The present application claims priority under 35 U.S.C. §119 to Japanese Patent Application No. 2012-140124, filed Jun. 21, 2012. The contents of this application are incorporated herein by reference in their entirety.

BACKGROUND OF THE INVENTION

Field of the Invention

The present invention relates to a directed self-assembly composition for pattern formation, and a pattern-forming method.

Discussion of the Background

Miniaturization of various types of electronic device structures such as semiconductor devices and liquid crystal devices has been accompanied by demands for miniaturization of patterns in lithography processes. At present, although fine resist patterns having a line width of about 40 nm can be formed using ArF excimer laser light or the like, even finer pattern formation has been demanded.

To meet such demands, a number of pattern-forming methods are proposed which utilize a phase separation structure induced by the so-called directed self-assembly which leads to spontaneous formation of an ordered pattern. As an example, a method for forming a superfine pattern is known which utilizes directed self-assembly of a block copolymer produced by copolymerizing a monomer compound with a certain property and another monomer compound with a different property (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383). According to this method, by annealing a composition containing the block copolymer, polymer structures having the same property can be assembled, to self-consistently form a pattern. Also, a method is disclosed in which a fine pattern is formed by directed self-assembling of a composition containing a plurality of polymers each having a distinct property (U.S. Patent Application Publication No. 2009/0214823; also see, Japanese Unexamined Patent Application, Publication No. 2010-58403).

SUMMARY OF THE INVENTION

According to one aspect of the present invention, a directed self-assembly composition for pattern formation, includes two or more kinds of polymers. The two or more kinds of polymers each do not have a silicon atom in a main chain thereof. At least one of the two or more kinds of polymers has a group binding to the polymerizing end of the main chain and having a hetero atom.

According to another aspect of the present invention, a pattern-forming method, includes forming a directed self-assembled film having a phase separation structure using the directed self-assembly composition for pattern formation. A part of a phase of the directed self-assembled film is removed to form a pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
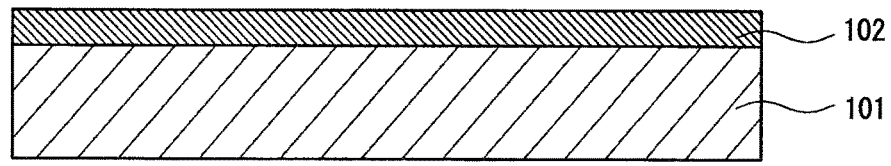
FIG. 1 is a schematic view showing an exemplary state after an underlayer film is provided on a substrate in the pattern-forming method according to an embodiment of the present invention.

An embodiment of the invention made for the purpose of solving the problems relates to a directed self-assembly composition for pattern formation, containing:

two or more kinds of polymers each not having a silicon atom in the main chain thereof; wherein, at least one of the two or more kinds of polymers has a group binding to the polymerizing end of the main chain and having a hetero atom.

Furthermore, a pattern-forming method according to another embodiment of the present invention includes the steps of:

forming a directed self-assembled film having a phase separation structure using the directed self-assembly composition for pattern formation; and removing a part of the phase of the directed self-assembled film to form a pattern.

The term "organic group" as referred to herein means a group having at least one carbon atom(s). The term "hetero atom" as referred to herein means atoms other than a carbon atom and a hydrogen atom.

The embodiment of the present invention can provide a directed self-assembly composition for pattern formation enabling a sufficiently fine pattern size and/or pitch size to be provided, and a pattern-forming method using the same. Therefore, the pattern-forming method can be suitably used in, for example, lithography processes in manufacture of various types of electronic devices such as semiconductor devices, liquid crystal devices and optical devices, and the like, for which further microfabrication is demanded.

The embodiments will now be described with reference to the accompanying drawings, wherein like reference numerals designate corresponding or identical elements throughout the various drawings.

Directed Self-Assembly Composition for Pattern Formation

The directed self-assembly composition for pattern formation according to an embodiment of the present invention contains two or more kinds of polymers each not having a silicon atom in the main chain thereof (hereinafter, a component including the two or more kinds of polymers each not having a silicon atom may be also referred to as "(A) polymer component"). In addition, the directed self-assembly composition for pattern formation may contain (B) a solvent. Moreover, the directed self-assembly composition for pattern formation may contain optional components such as a surfactant within a range not leading to impairment of the effects of the present invention. It is to be noted, however, that the directed self-assembly composition for pattern formation preferably does not contain any other polymers than the polymer component (A).

The term "directed self-assembly" as referred to herein means a phenomenon of spontaneously configuring a tissue or structure without resulting only from the control by any external factor. In the embodiment of the present invention, the directed self-assembly composition for pattern formation is applied on a substrate, and annealing or the like is carried out to form a film having a phase separation structure by directed self-assembly (directed self-assembled film). Then a part of the phase in the directed self-assembled film is removed to form a pattern. Each component will be described in detail below.

(A) Polymer Component

The polymer component (A) includes two or more kinds of polymers each not having a silicon atom in the main chain thereof. At least one of the two or more kinds of polymers has a group binding to the polymerizing end of the main chain and having a hetero atom (hereinafter, may be also referred to as "group (a)"). Hereinafter, the polymer having the group (a) may be also referred to as "(A1) polymer". The term "polymerizing end" as referred to herein means a growing end of a polymer in a polymerization reaction. In addition, the polymer component (A) may include a polymer not having a silicon atom in the main chain thereof and differing from the polymer (A1) (hereinafter, may be also referred to as "(A2) polymer"). When the directed self-assembly composition for pattern formation contains the polymer (A1), phase separation of the polymers with different properties is promoted due to the structure of the group (a) bound to the end of the main chain, leading to formation of a fine pattern.

Although the polymer component (A) needs to include at least two kinds of polymers, two, or three or more kinds of polymers may be present therein. At least one of these polymers needs to be the polymer (A1); however, one, or two or more kinds of polymer (A1) may be present in the polymer component (A). When the polymer (A2) is included in the polymer component (A), one, or two or more kinds of polymer (A2) may be present in the polymer component (A).

Examples of combinations of the polymers constituting the polymer component (A) include a combination of two or more kinds of polymer (A1), a combination of one kind of polymer (A1) and one kind of polymer (A2), a combination of two or more kinds of polymer (A1) and one kind of polymer (A2), a combination of one kind of polymer (A1) and two or more kinds of polymer (A2), a combination consisting of two or more kinds of polymer (A1) and two or more kinds of polymer (A2), and the like.

The polymer not having a silicon atom in the main chain thereof preferably includes a polymer having carbon atoms in the main chain thereof, and more preferably a polymer having a carbon-carbon bond in the main chain thereof.

The proportion of carbon atoms involved in the carbon-carbon bond with respect to the total number of atoms constituting the main chain is preferably no less than 50%, more preferably no less than 70%, still more preferably no less than 80%, and particularly preferably no less than 90%.

Examples of such a polymer include addition polymerization polymers such as styrene polymers, acrylate ester polymers, vinyl polymers, and diene polymers; polycondensation polymers such as urea polymers, imide polymers, and amide polymers; polyaddition polymers such as urethane polymers, and epoxy polymers; and the like. Of these, the addition polymerization polymers are preferred.

The styrene polymers are those which are obtained by polymerizing at least one monomer compound including a styrene compound. Examples of the styrene polymers include a polymer that includes a structural unit represented by the following formula (I) in an amount of typically no less than 50 mol %, preferably no less than 80 mol %, and particularly preferably 100 mol % with respect to the total structural units, and the like. Such styrene polymers are obtained by polymerizing at least one monomer compound including a styrene compound which yields the structural unit represented by the following formula (I).

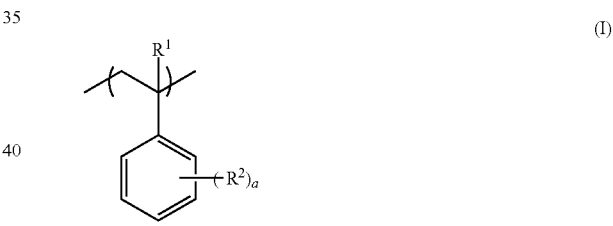

In the above formula (I), $R^1$ represents a hydrogen atom, a methyl group, a fluorine atom or a trifluoromethyl group. $R^2$ represents a monovalent organic group. "a" is an integer of 0 to 5. In the case where "a" is no less than 2, a plurality of $R^2$s are each identical or different.

Examples of the styrene compound include styrene, o-methylstyrene, p-methylstyrene, ethylstyrene, p-methoxystyrene, p-phenylstyrene, 2,4-dimethylstyrene, p-n-octylstyrene, p-n-decylstyrene, p-n-dodecylstyrene, and the like. Of these, styrene, o-methylstyrene and p-methylstyrene are preferred, and styrene is more preferred.

The acrylate ester polymers are those which are obtained by polymerizing at least one monomer compound including a (meth)acrylic acid ester compound. Examples of the acrylate ester polymers include a polymer having a structural unit represented by the following formula (II) in an amount of typically no less than 50 mol %, preferably no less than 80 mol %, and particularly preferably 100 mol % with respect to the total structural units, and the like. Such acrylate ester polymers are obtained by polymerizing at least one monomer compound including a (meth)acrylic acid ester compound which yields a structural unit represented by the following formula (II).

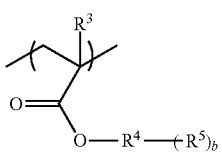
(II)

In the above formula (II), $R^3$ represents a hydrogen atom, a methyl group, a fluorine atom or a trifluoromethyl group. $R^4$ represents a hydrocarbon group having 1 to 5 carbon atoms and having a valency of (1+b). $R^5$ represents a monovalent hetero atom-containing group. "b" is an integer of 1 to 3. In the case where "b" is no less than 2, a plurality of $R^5$s are each identical or different.

Examples of the (meth)acrylic acid ester compound include:

methacrylate esters such as methyl methacrylate, ethyl methacrylate, n-propyl methacrylate, isopropyl methacrylate, n-butyl methacrylate, isobutyl methacrylate, tert-butyl methacrylate, n-pentyl methacrylate, n-hexyl methacrylate, cyclohexyl methacrylate, n-heptyl methacrylate, n-octyl methacrylate, 2-ethylhexyl methacrylate, nonyl methacrylate, decyl methacrylate, dodecyl methacrylate, phenyl methacrylate, toluoyl methacrylate, benzyl methacrylate, isobornyl methacrylate, 2-methoxyethyl methacrylate, 3-methoxybutyl methacrylate, 2-hydroxyethyl methacrylate, 2-hydroxypropyl methacrylate, stearyl methacrylate, glycidyl methacrylate, 2-aminoethyl methacrylate, trifluoromethyl methacrylate and 2,2,2-trifluoroethyl methacrylate; and acrylate esters such as methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, cyclohexyl acrylate, n-heptyl acrylate, n-octyl acrylate, 2-ethylhexyl acrylate, nonyl acrylate, decyl acrylate, dodecyl acrylate, phenyl acrylate, toluoyl acrylate, benzyl acrylate, isobornyl acrylate, 2-methoxyethyl acrylate, 3-methoxybutyl acrylate, 2-hydroxyethyl acrylate, 2-hydroxypropyl acrylate, stearyl acrylate, glycidyl acrylate and 2-aminoethyl acrylate.

The vinyl polymers are those which are obtained by polymerizing at least one monomer compound including a vinyl compound.

Examples of the vinyl compound include vinyl acetal, vinyl chloride, vinylidene chloride, and the like.

The diene polymers are those which are obtained by polymerizing at least one monomer compound including a diene compound.

Examples of the diene compound include 1,3-butadiene, isoprene, 2,3-dimethyl-1,3-butadiene, and the like.

It is to be noted that each polymer described above may be a homopolymer obtained by polymerizing one type of the monomer compound, or a copolymer obtained by polymerizing two or more types of the monomer compounds, and the homopolymer is preferred.

Hereinafter, the polymer (A1) and the polymer (A2) will be explained.

(A1) Polymer

Examples of the polymer (A1) include the polymers exemplified as the polymer not having a silicon atom in the main chain thereof, in which the group (a) is bound to the polymerizing end of the main chain, and the like. Of these, the polymer (A1) is preferably a styrene polymer, and more preferably polystyrene. When the styrene polymer has the group (a), its phase separation is more facilitated.

The binding site of the group (a) to the main chain of the polymer (A1) is not particularly limited as long as the group (a) is bound to the polymerizing end. When the polymer grows at its both ends, the binding site of the group (a) may be at one of both polymerizing ends of the main chain or at both the polymerizing ends, and the former is preferred in view of ease of the synthesis of the polymer (A1). It is to be noted that one, or two or more types of the group (a) may be present in the polymer (A1).

The hetero atom included in the group (a) is preferably an oxygen atom, a nitrogen atom, a sulfur atom, a phosphorus atom, a silicon atom, a tin atom or a combination thereof.

Since the inclusion of the hetero atom in the group (a) further facilitates the phase separation, a fine pattern can be formed more accurately. Of these hetero atoms, an oxygen atom and a nitrogen atom are more preferred, and the oxygen atom is still more preferred.

Examples of the group (a) include groups represented by the following formulae (1-1) to (1-51) (hereinafter, may be also referred to as "groups (1-1) to (1-51)"), and the like.

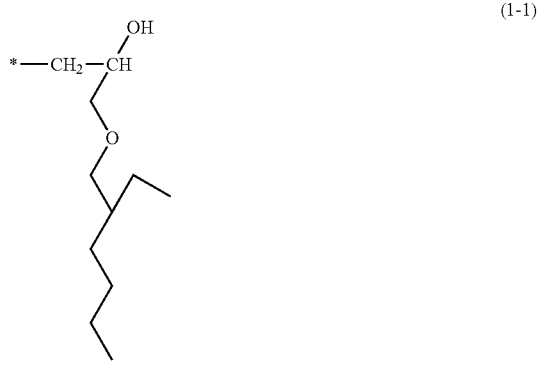
(1-1)

(1-2)

(1-3)

(1-4)

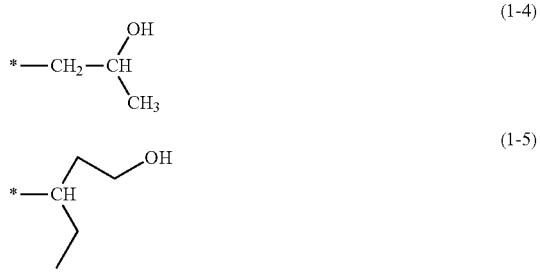
(1-5)

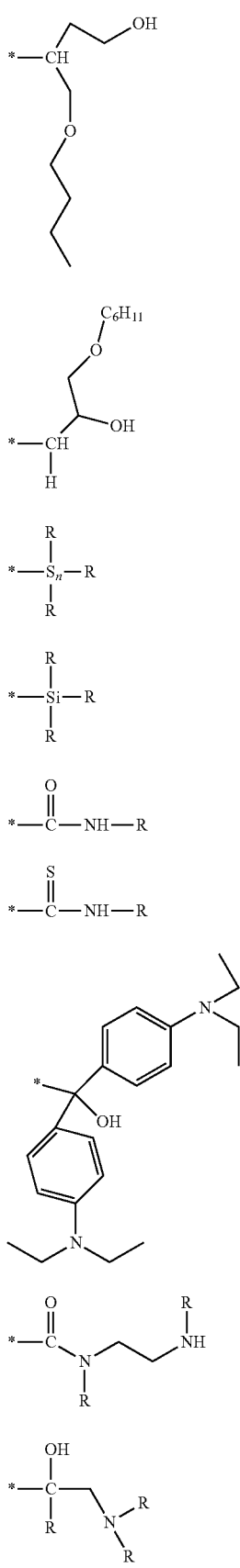
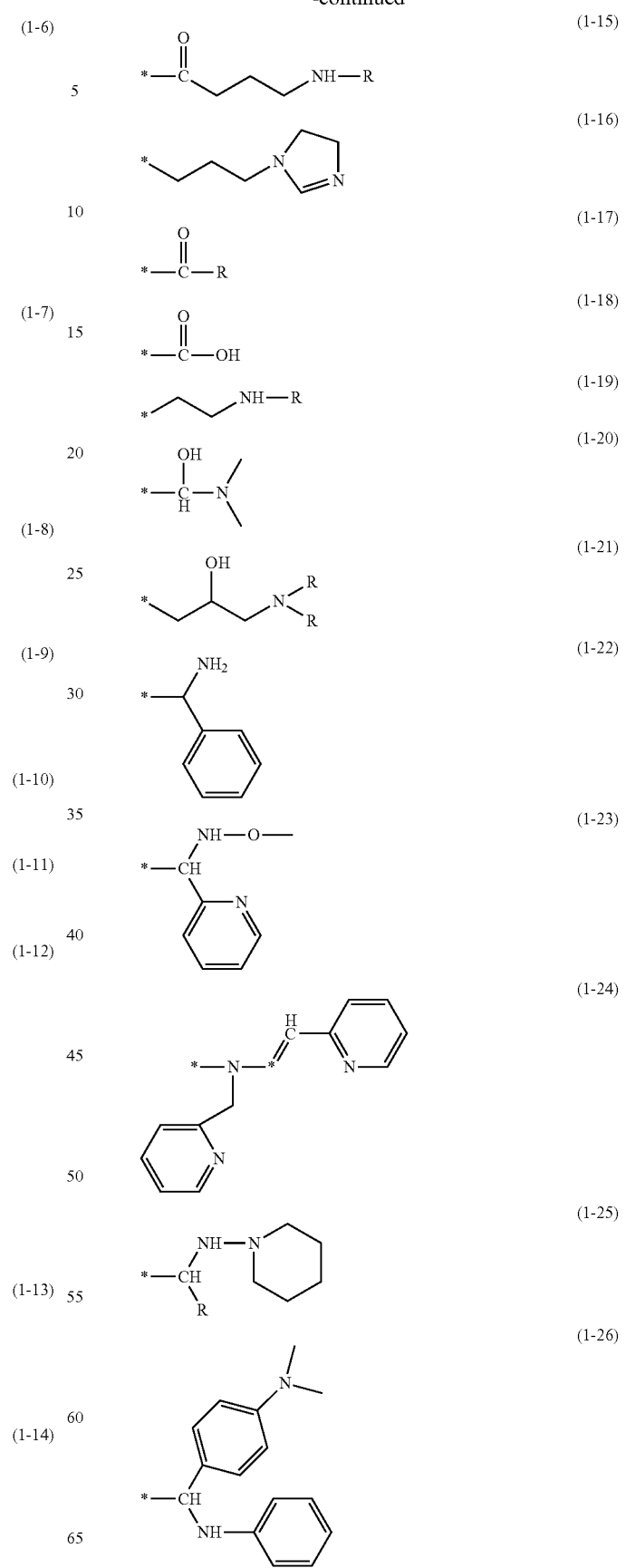

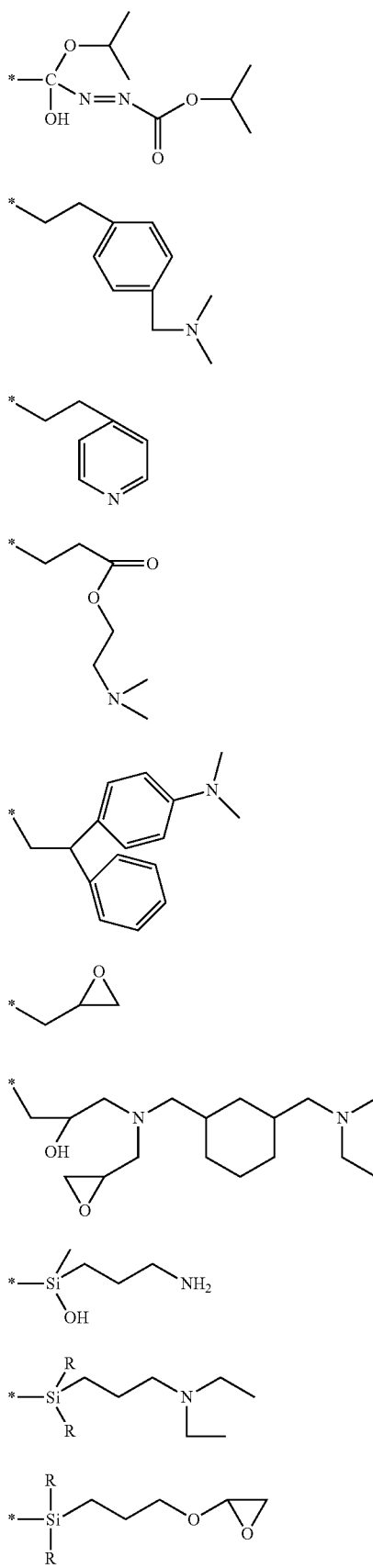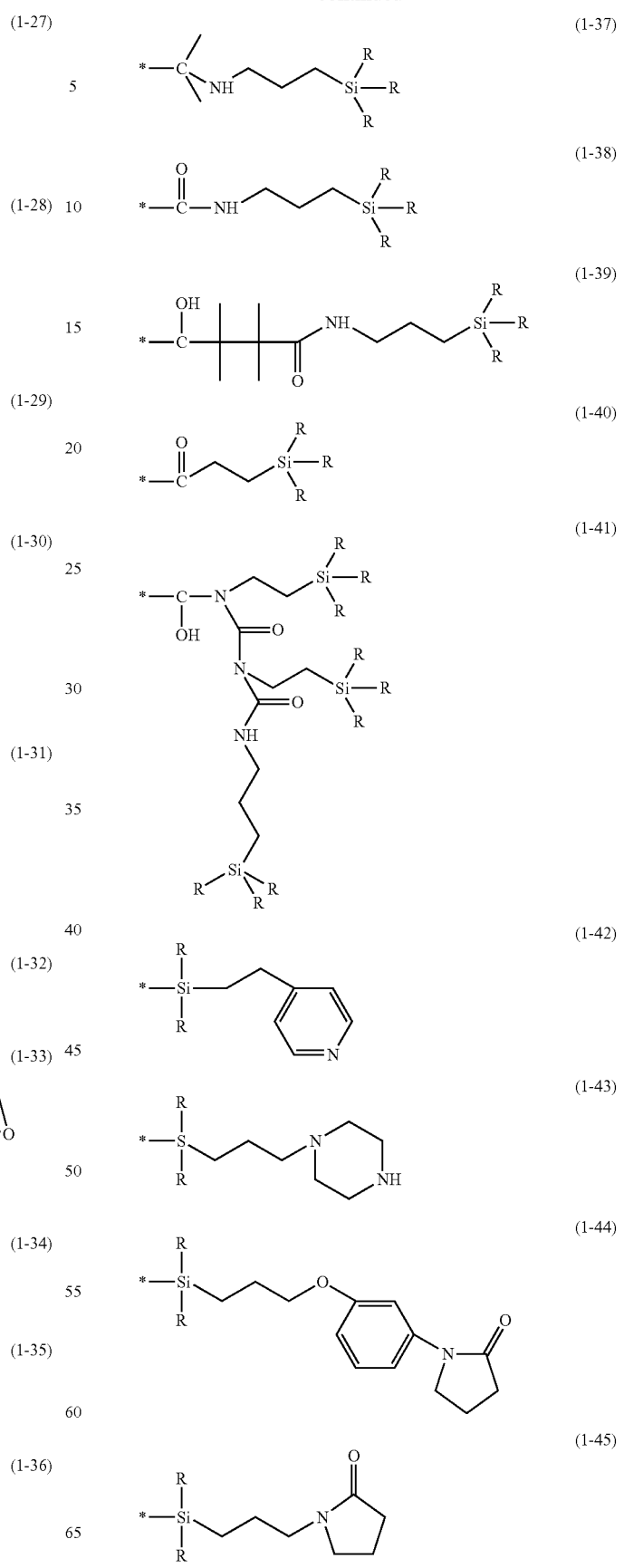

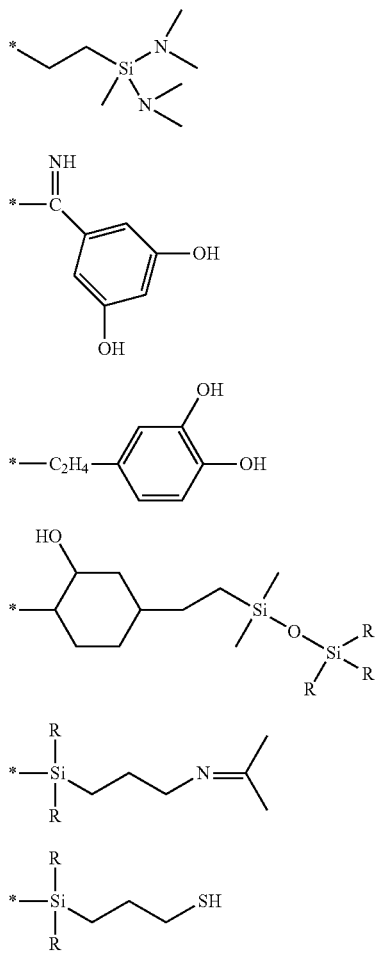

(1-46)
(1-47)
(1-48)
(1-49)
(1-50)
(1-51)

In the above formulae (1-1) to (1-51), R represents a hydrogen atom, a halogen atom or a monovalent organic group having 1 to 30 carbon atoms. "*" indicates a binding site to the polymerizing end of the main chain of the polymer.

Examples of the monovalent organic group having 1 to 30 carbon atoms represented by R include a monovalent aliphatic linear hydrocarbon group having 1 to 30 carbon atoms, a monovalent alicyclic hydrocarbon group having 3 to 30 carbon atoms, a monovalent aromatic hydrocarbon group having 6 to 30 carbon atoms, an alkoxy group having 1 to 30 carbon atoms, and the like.

Examples of the halogen atom include a fluorine atom, a chlorine atom, a bromine atom, an iodine atom, and the like.

Examples of the monovalent aliphatic linear hydrocarbon group having 1 to 30 carbon atoms include a methyl group, an ethyl group, a n-propyl group, an i-propyl group, a n-butyl group, an i-butyl group, a n-pentyl group, an i-pentyl group, a n-hexyl group, an i-hexyl group, and the like.

Examples of the monovalent alicyclic hydrocarbon group having 3 to 30 carbon atoms include a cyclopropyl group, a cyclobutyl group, a cyclopentyl group, a cyclooctyl group, a norbornyl group, an adamantyl group, and the like.

Examples of the monovalent aromatic hydrocarbon group having 6 to 30 carbon atoms include a phenyl group, a naphthyl group, an anthryl group, and the like.

Examples of the alkoxy group having 1 to 30 carbon atoms include a methoxy group, an ethoxy group, a propoxy group, and the like.

As the group (a), the groups (1-1) to (1-7), the group (1-10), the group (1-11), the group (1-14), the group (1-18), and the group (1-46) are preferred.

Examples of a method for binding the group (a) to an end of the main chain (hereinafter, may be also referred to as "end processing" or "end processing method") include a method in which a hetero atom-containing end processing agent such as an epoxy compound is reacted with an active end of the main chain of the polymer obtained by polymerizing at least one monomer compound to form a chemical bond, followed by a demetallization treatment with an acid to introduce the group (a) into the polymerizing end of the main chain, and the like.

The end processing agent may be selected appropriately, depending on the structure of the group (a).

Examples of the end processing agent include:

epoxy compounds such as 1,2-butylene oxide, butyl glycidyl ether, propylene oxide, ethylene oxide, 2-ethylhexyl glycidyl ether and epoxyamines;

nitrogen-containing compounds such as: isocyanate compounds, thioisocyanate compounds, imidazolidinones, imidazoles, aminoketones, pyrrolidones, diethylaminobenzophenones, nitrile compounds, aziridines, formamides, epoxyamines, benzylamines, oxime compounds, azines, hydrazones, imines, azocarboxylate esters, aminostyrenes, vinylpyridines, aminoacrylates, aminodiphenylethylenes and imide compounds;

silane compounds such as alkoxysilanes, aminosilanes, ketoiminosilanes, isocyanate silanes, siloxanes, glycidylsilanes, mercaptosilanes, vinylsilanes, epoxysilanes, pyridylsilanes, piperazylsilanes, pyrrolidone silanes, cyanosilanes and isocyanic silanes;

tin halides, silicon halides, carbon dioxide, and the like.

Among these, the epoxy compounds are preferred, and 1,2-butylene oxide, butyl glycidyl ether and propylene oxide are more preferred.

By way of example, in the case where a certain epoxy compound (1,2-butylene oxide) is bound to a styrene polymer, examples of the end processing method include a method illustrated in the following scheme, and the like. More specifically, n-butyllithium as a polymerization initiator is added to styrene as the monomer compound to effect an anionic polymerization, and the active end of the main chain of the polymer thus formed is reacted with the epoxy compound to allow the epoxy group to be cleaved and bound thereto. Subsequently, an acid is further added, thereby enabling the group (a) bound to the end of the main chain to be formed.

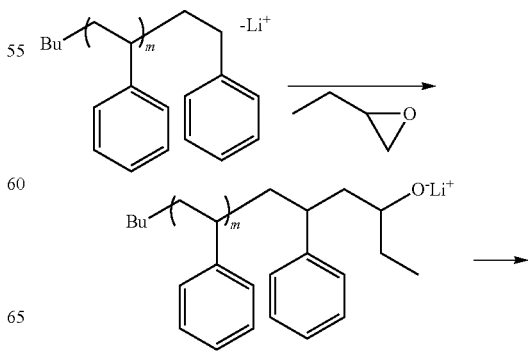

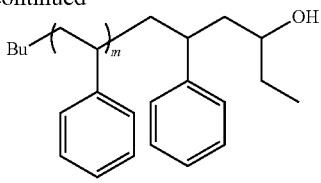

In the above scheme, m is an integer of 10 to 5,000.

The group (a) is preferably a group having —OH or —NR$_2$, and more preferably a group represented by the following formula (1). R each independently represents a hydrogen atom, a halogen atom or a monovalent organic group having 1 to 30 carbon atoms. Such a group (a) further facilitates the phase separation, leading to formation of a fine pattern with still higher accuracy.

  (1)

In the above formula (1), R$^1$ represents a divalent organic group having 1 to 30 carbon atoms.

Examples of the divalent organic group having 1 to 30 carbon atoms represented by R$^1$ include a divalent hydrocarbon group having 1 to 30 carbon atoms, (x) a divalent hydrocarbon group having 1 to 30 carbon atoms and further having a hetero atom-containing group intervening between the carbon atoms, (y) a group derived from the divalent hydrocarbon group having 1 to 30 carbon atoms or the group (x) by substituting a part or all of hydrogen atoms included therein by a substituent, and the like.

Examples of the divalent hydrocarbon group having 1 to 30 carbon atoms include a divalent linear hydrocarbon group having 1 to 30 carbon atoms, a divalent alicyclic hydrocarbon group having 3 to 30 carbon atoms, a divalent aromatic hydrocarbon group having 6 to 30 carbon atoms, and the like.

Examples of the divalent linear hydrocarbon group having 1 to 30 carbon atoms include a methanediyl group, an ethanediyl group, a n-propanediyl group, an i-propanediyl group, a n-butanediyl group, an i-butanediyl group, a n-pentanediyl group, an i-pentanediyl group, a n-hexanediyl group, an i-hexanediyl group, and the like.

Examples of the divalent alicyclic hydrocarbon group having 3 to 30 carbon atoms include a cyclopropanediyl group, a cyclobutanediyl group, a cyclopentanediyl group, a cyclohexanediyl group, a cyclooctanediyl group, a norbornanediyl group, an adamantanediyl group, and the like.

Examples of the divalent aromatic hydrocarbon group having 6 to 30 carbon atoms include a phenylene group, a naphthylene group, an antholylene group, a toluenediyl group, a phenylethanediyl group, a xylenediyl group, and the like.

Examples of the hetero atom included in the group (x) include the same atoms as exemplified as the hetero atom which may be included in the group (a), and the like.

Examples of the hetero atom-containing group intervening between the carbon atoms of the group (x) include —O—, —S—, —NR'—, —CO—, —CS—, —N=N— and combinations thereof, and the like. R' represents a monovalent hydrocarbon group having 1 to 10 carbon atoms.

Examples of the substituent include: a halogen atom such as a fluorine atom, a chlorine atom, a bromine atom, and an iodine atom; a cyano group; a nitro group; an amino group; a sulfanyl group; a keto group (=O); an imino group (=NH); and the like.

Examples of the group (x) include a 3-butoxypropane-1, 2-diyl group, a 2-butoxybutane-2,4-diyl group, a 3-octyloxypropane-1,2-diyl group, a 3-hexyloxy-1,2-diyl group, and the like.

Examples of the group (y) include a 1-cyano ethane-1,2-diyl group, a di(4-diethylaminophenyl)methane-1,1-diyl group, a 3-dimethylamino propyl-2,2-diyl group, a 3-dimethylaminopropyl-1,2-diyl group, a dimethylaminomethane-1,1-diyl group, a carbonyl group, and the like.

Examples of the group (a) represented by the above formula (1) include groups represented by the above formulae (1-1) to (1-7), (1-12), (1-14), (1-18), (1-20), (1-21), (1-27), (1-33), (1-34), (1-39), (1-41) and (1-47) to (1-49), and the like. Of these, the groups represented by the formulae (1-2) to (1-4) are preferred in view of allowing the phase separation of the directed self-assembled film to efficiently proceed.

The group (a) represented by the above formula (1) is preferably a group derived from an epoxy compound. More specifically, it is preferred to react an epoxy compound with the active end of the main chain of the polymer, to allow the group (a) including a —OH to be bound thereto. Accordingly, the polymer having the group (a) represented by the above formula (1) bound to the end of the main chain thereof can be simply and surely provided. It is to be noted that the epoxy compound and the methods for reacting the same which are mentioned in the explanation of the group (a) may be applied to this case as well.

The content of the polymer (A1) in the polymer component (A) is typically 1% by mass to 100% by mass, preferably 5% by mass to 100% by mass, more preferably 10% by mass to 90% by mass, still more preferably 20% by mass to 80% by mass, and particularly preferably 30% by mass to 70% by mass. When the content of the polymer (A1) falls within such a range, formation of a more complex and finer pattern can be achieved.

Synthesis Method of Polymer (A1)

The polymer (A1) may be synthesized by living anionic polymerization, living radical polymerization, or the like. Among these, the living anionic polymerization is preferred since it allows any group to be bound to the end of the main chain of the polymer.

Examples of the synthesis method of the polymer (A1) include a method in which a solution containing at least one monomer compound such as styrene is added dropwise to a solvent containing a polymerization initiator to allow the polymerization to proceed, and thereafter the active end of the main chain of the polymer formed is subjected to an end processing with an appropriately-selected end processing agent to synthesize the polymer (A1), and the like.

Examples of the solvent include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene and ethylbenzene;

halogenated hydrocarbons such as chlorobutanes, bromohexanes, dichloroethanes, hexamethylene dibromide and chlorobenzene;

saturated carboxylate esters such as ethyl acetate, n-butyl acetate, i-butyl acetate and methyl propionate;

ketones such as acetone, 2-butanone, 4-methyl-2-pentanone and 2-heptanone;

ethers such as tetrahydrofuran, dimethoxyethane and diethoxyethane; and alcohols such as methanol, ethanol, 1-propanol, 2-propanol and 4-methyl-2-pentanol. These solvents may be used either alone, or in combination of two or more thereof.

The reaction temperature in the polymerization is typically −150° C. to 50° C., and preferably −80° C. to 40° C. The reaction time is typically 5 min to 24 hrs, and preferably 20 min to 12 hrs.

Examples of the polymerization initiator include alkyllithiums, alkylmagnesium halides, naphthalene sodium, alkylated lanthanoid compounds, and the like. Of these, alkyllithiums are preferred, sec-butyllithium and n-butyllithium are more preferred, and sec-butyllithium is still more preferred.

The same end processing methods as those described for the group (a) may be applied to the end processing for the synthesis of the polymer (A1).

The polymer subjected to the end processing is preferably recovered by a reprecipitation method. More specifically, after completion of the end processing reaction, the targeted resin may be recovered as a powder by pouring the reaction solution into a reprecipitation solvent. Examples of the reprecipitation solvent include alcohols, alkanes and the like, and the alcohols and alkanes may be used alone or as a mixture of two or more thereof. As an alternative to the reprecipitation method, the polymer may be recovered by removing low-molecular-weight components such as monomers and oligomers by a liquid separation operation and a column chromatographic operation, an ultrafiltration operation and the like.

The weight average molecular weight (MW) of the polymer (A1) as determined by gel permeation chromatography (GPC) is, each independently, preferably 1,000 to 200,000, more preferably 2,000 to 150,000, and still more preferably 3,000 to 100,000. When the Mw of the polymer (A1) falls within such a range, the directed self-assembly composition for pattern formation can form a pattern with a finer microdomain structure.

The ratio of the Mw to number average molecular weight (Mn) of polymer (A1), i.e., Mw/Mn, each independently, falls within a range of typically 1 to 5, preferably 1 to 3, more preferably 1 to 2, still more preferably 1 to 1.5, and particularly preferably 1 to 1.2. When the Mw/Mn falls within such a range, the directed self-assembly composition for pattern formation can give a pattern with a fine and favorable microdomain structure with higher accuracy.

(A2) Polymer

Examples of the polymer (A2) include the polymer exemplified as the polymer not having a silicon atom in the main chain thereof in which the group (a) is absent at the end of the main chain, and the like.

The polymer (A2) is preferably an acrylate ester polymer. Examples of preferred methacrylate esters giving the acrylate ester polymer include methyl methacrylate, phenyl methacrylate, 2-hydroxypropyl methacrylate, and 2,2,2-trifluoroethyl methacrylate. Examples of preferred acrylate esters giving the acrylate ester polymers include methyl acrylate.

The content of the polymer (A2) in the polymer component (A) is typically 0% by mass to 90% by mass, preferably 0% by mass to 80% by mass, more preferably 0% by mass to 70% by mass, and still more preferably 30% by mass to 60% by mass.

Synthesis of Polymer (A2)

Examples of the synthesis method of the polymer (A2) involve radical polymerization, living anionic polymerization, living radical polymerization, and the like.

The Mw of the polymer (A2) is each independently, preferably 500 to 1,000,000, more preferably 1,000 to 500,000, still more preferably 1,500 to 100,000, and particularly preferably 1,500 to 20,000. When the Mw of the polymer (A2) falls within such a range, the directed self-assembly composition for pattern formation can form a pattern with a finer microdomain structure.

Mw/Mn of the polymer (A2) is each independently falls within a range of typically 1 to 5, preferably 1 to 3, more preferably 1 to 2, still more preferably 1 to 1.5, and particularly preferably 1 to 1.2. When the Mw/Mn falls within such a range, the directed self-assembly composition for pattern formation can form a pattern having a fine and favorable microdomain structure with higher accuracy.

The combination of the two or more kinds of polymers in the polymer component (A) is preferably a combination of a styrene polymer and an acrylate ester polymer, more preferably a combination of the styrene polymer as the polymer (A1) and the acrylate ester polymer as the polymer (A2), and still more preferably a combination in which the styrene polymer as the polymer (A1) is polystyrene. When the polymer component (A) is the combination of the polymers described above, a phase separation structure can be easily and surely formed.

The content of the polymer component (A) with respect to the total solid content in the directed self-assembly composition for pattern formation is preferably no less than 50% by mass, and more preferably no less than 70% by mass.

(B) Solvent

The directed self-assembly composition for pattern formation according to the embodiment of the present invention typically includes (B) a solvent. Examples of the solvent (B) include alcohol solvents, ether solvents, ketone solvents, amide solvents, ester solvents, hydrocarbon solvents, and the like. These solvents may be used either alone, or in combination of two or more thereof.

Examples of the alcohol solvents include:

monohydric alcohol solvents such as methanol, ethanol, n-propanol, i-propanol, n-butanol, i-butanol, sec-butanol, tert-butanol, n-pentanol, i-pentanol, 2-methylbutanol, sec-pentanol, tort-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol; and polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, diethylene glycol dimethyl ether, diethylene glycol ethyl methyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether.

Examples of the ether solvents include diethyl ether, dipropyl ether, dibutyl ether, diphenyl ether, and the like.

Examples of the ketone solvents include acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclopentanone, cyclohexanone, cycloheptanone, cyclooctanone, methylcyclohexanone, 2,4-pentanedione, acetonyl acetone, acetophenone, and the like.

Examples of the amide solvents include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester solvents include diethyl carbonate, propylene carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate (PGMEA), propylene glycol monoethyl ether acetate, propylene glycol monopropyl ether acetate, propylene glycol monobutyl ether acetate, dipropylene glycol monomethyl ether acetate, dipropylene glycol monoethyl ether acetate, diglycol acetate, methoxytriglycol acetate, ethyl propionate, n-butyl propionate, i-amyl propionate, 3-methoxymethyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon solvent include:

aliphatic hydrocarbon solvents such as n-pentane, pentane, n-hexane, i-hexane, n-heptane, i-heptane, 2,2,4-trimethylpentane, n-octane, i-octane, cyclohexane and methylcyclohexane; and aromatic hydrocarbon solvents such as benzene, toluene, xylene, mesitylene, ethylbenzene, trimethylbenzene, methylethylbenzene, n-propylbenzene, i-propylbenzene, diethylbenzene, i-butylbenzene, triethylbenzene, di-i-propylbenzene and n-amylnaphthalene.

Of these, the ester solvents and the ketone solvents are preferred; PGMEA, cyclohexanone and γ-butyrolactone are more preferred, and PGMEA is still more preferred. These solvents may be used either alone, or in combination of two or more thereof.

Optional Component

Examples of the optional components that may be contained in the directed self-assembly composition for pattern formation include a surfactant, and the like. When the directed self-assembly composition for pattern formation contains the surfactant, coating properties onto substrates and the like may be improved. Examples of the surfactant include nonionic surfactants, fluorochemical surfactants and silicone-based surfactants. These optional components may be used either alone, or in combination of two or more thereof.

Preparation Method of Directed Self-Assembly Composition for Pattern Formation

The directed self-assembly composition for pattern formation may be prepared, for example, by mixing the polymer component (A) including the polymer (A1), etc., and other optional components such as the surfactant as required in the solvent (B) in a predetermined ratio. The solid content concentration of the directed self-assembly composition for pattern formation is preferably 0.01% by mass to 50% by mass, more preferably 0.05% by mass to 30% by mass, and still more preferably 0.1% by mass to 10% by mass. Note that, the directed self-assembly composition for pattern formation may be prepared by filtering the same through a filter with a pore size of about 200 nm after mixing each component.

Pattern-Forming Method

The pattern-forming method according an embodiment of the present invention includes the steps of:

forming a directed self-assembled film having a phase separation structure using the directed self-assembly composition for pattern formation according to the embodiment of the present invention (hereinafter, may be also referred to as "directed self-assembled film formation step"); and removing a part of the phase of the directed self-assembled film (hereinafter, may be also referred to as "removal step").

Moreover, preferably, the pattern-forming method according the embodiment of the present invention further includes, prior to the directed self-assembled film formation step, the step of providing an underlayer film on a substrate (hereinafter, may be also referred to as "underlayer film provision step"), and the step of forming a prepattern on the underlayer film (hereinafter, may be also referred to as "prepattern formation step"), and still further includes, in the directed self-assembled film formation step, the step of forming the directed self-assembled film in a region on the underlayer film segregated by the prepattern, and further includes, the step of removing the prepattern (hereinafter, may be also referred to as "prepattern removal step") after the directed self-assembled film formation step. Hereinafter, each step will be explained in detail with reference to FIGS. 1 to 5.

Underlayer Film Provision Step

In this step, an underlayer film is provided on a substrate using an underlayer film-providing composition. This step can produce a substrate 101 having an underlayer film 102 provided thereon, as shown in FIG. 1, and the directed self-assembled film is formed on the underlayer film 102. A phase separation structure (microdomain structure) presented by the directed self-assembled film is altered, depending on an interaction between the polymers in the polymer component (A) included in the directed self-assembly composition for pattern formation, as well as on an interaction between the polymers in the polymer component (A) and the underlayer film 102; therefore, the presence of the underlayer film 102 allows control of the structure, leading to formation of a desired pattern. Furthermore, in the case of the directed self-assembled film being a thin film, the presence of the underlayer film 102 leads to improvement of a transfer processes thereof.

As the substrate, for example, conventionally well-known substrates such as a silicon wafer and a wafer coated with aluminum can be used.

Moreover, as the underlayer film-providing composition, commercially available underlayer film-providing compositions may be used.

A method for providing the underlayer film 102 is not particularly limited; for example, the underlayer film 102 may be provided by coating the underlayer film-providing composition onto the substrate 101 by means of well-known methods such as a spin coating technique and the like to provide a coating film, and exposing the coating film to light and/or heat to cure the same. Examples of the radioactive rays used in the exposure include visible light rays, ultraviolet rays, far ultraviolet rays, X-rays, electron beams, γ-rays, molecular beams, ion beams, and the like. In addition, the temperature employed for heating the coating film is not particularly limited, but is preferably 90° C. to 550° C., more preferably 90° C. to 450° C., and still more preferably 90° C. to 300° C. Also, the film thickness of the underlayer film 102 is not particularly limited, but is preferably 10 nm to 20,000 nm, and more preferably 20 nm to 1,000 nm. Note that, the underlayer film 102 preferably includes a SOC (Spin on carbon) film.

Prepattern Formation Step

Figure 2:
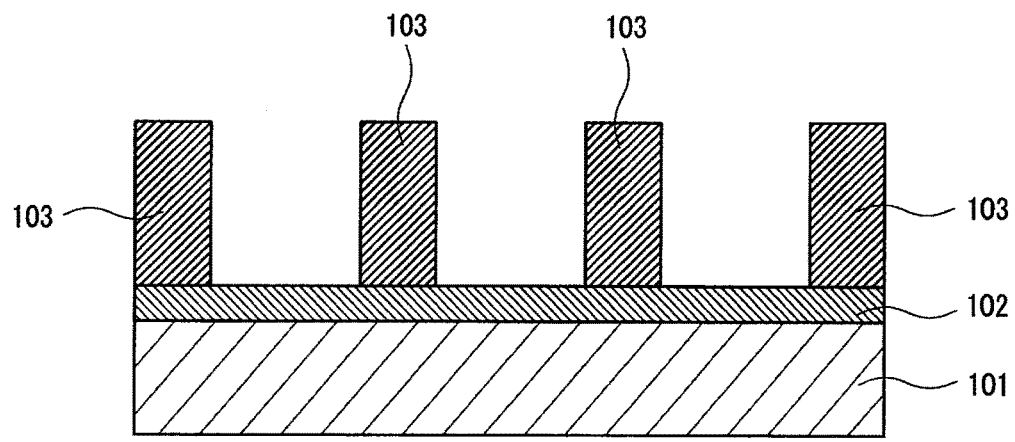
FIG. 2 is a schematic view showing an exemplary state after prepatterns are formed on an underlayer film in the pattern-forming method according to the embodiment of the present invention.

In this step, a prepattern 103 is formed on the underlayer film 102 using a prepattern-forming composition, as shown in FIG. 2. The presence of the prepattern 103 allows for control of the phase separation of the directed self-assembly composition for pattern formation, leading to formation of a desired fine pattern. More specifically, among the polymers included in the directed self-assembly composition for pattern formation, a polymer having high affinity for a lateral face of the prepattern (hereinafter, may be also referred to as "first polymer") forms a phase along the prepattern, and a polymer having low affinity for the lateral face of the prepattern (hereinafter, may be also referred to as "second polymer") forms a phase in a position far from the prepattern. This allows for formation of the desired pattern. In addition, it is possible to finely control the phase separation structure formed by directed self-assembly composition for pattern formation based on the material entity, length, thickness, shape and the like of the prepattern. Note that, the prepattern may be selected as appropriate in accordance with the pattern desired to be finally formed.

The methods for forming the prepattern 103 may be similar to well-known resist pattern-forming methods. In addition, conventional resist film-providing compositions may be used as the prepattern-forming composition. In one example of specific methods for forming the prepattern 103, a commercially available chemically amplified type resist composition may be coated onto the underlayer film 102 to provide a resist film. Next, a desired region of the resist film may be irradiated with a radioactive ray through a mask having a specific pattern, to carry out liquid immersion lithography. The radioactive ray may be exemplified by an ultraviolet ray, a far ultraviolet ray, an X-ray, a charged particle ray, and the like. Among these, a far ultraviolet ray is preferred, and an ArF excimer laser beam and a KrF excimer laser beam are more preferred, and an ArF excimer laser beam is still more preferred. Next, post exposure baking (PEB) may be conducted, followed by development using a developer solution such as an alkaline developer solution, to form the desired prepattern 103.

It is to be noted that a surface of the prepattern 103 may be subjected to a hydrophobization treatment or a hydrophilization treatment. Examples of specific treatment methods include a hydrogenation treatment, in which the surface of the prepattern 103 is exposed to hydrogen plasma for a predetermined period of time, and the like. An increase in hydrophobicity or hydrophilicity of the surface of the prepattern 103 leads to facilitation of the directed self-assembling of the directed self-assembly composition for pattern formation.

Due to the pattern-forming method involving the underlayer film and prepattern, the phase separation of the directed self-assembly composition for pattern formation can be precisely controlled, and further miniaturization of the pattern formed may be achieved.

Directed Self-Assembled Film Formation Step

Figure 3:
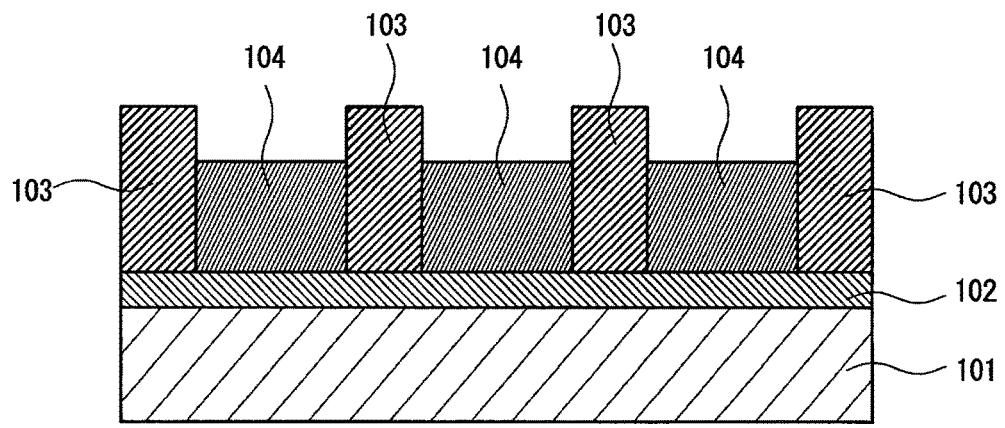
FIG. 3 is a schematic view showing an exemplary state after a directed self-assembly composition for pattern formation is coated onto a region on the underlayer film sandwiched between the prepatterns in the pattern-forming method according to an embodiment of the present invention.
Figure 4:
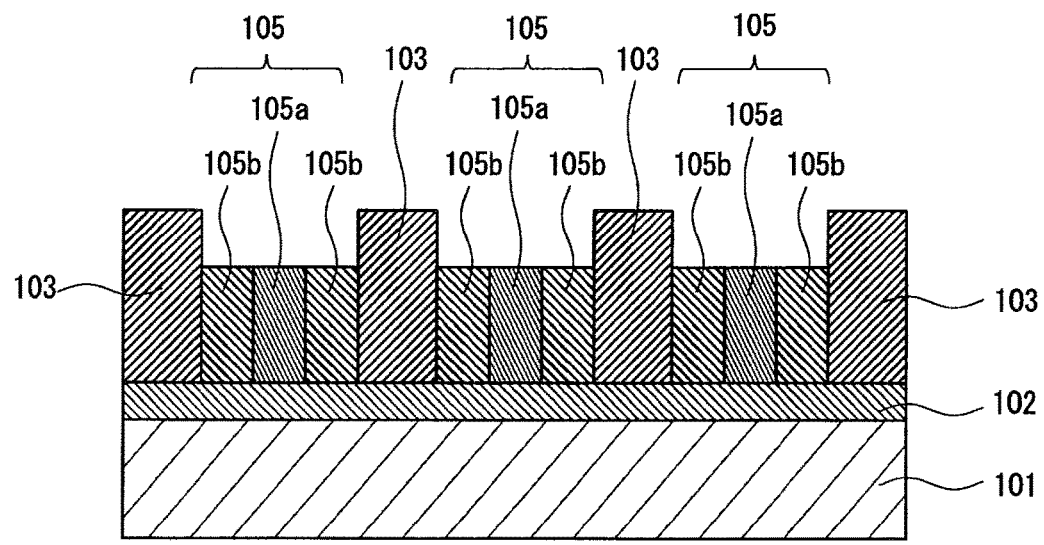
FIG. 4 is a schematic view showing, in the case of line-and-space pattern formation, an exemplary state after a directed self-assembled film is formed in a region on the underlayer film sandwiched between the prepatterns in the pattern-forming method according to an embodiment of the present invention.
Figure 6:
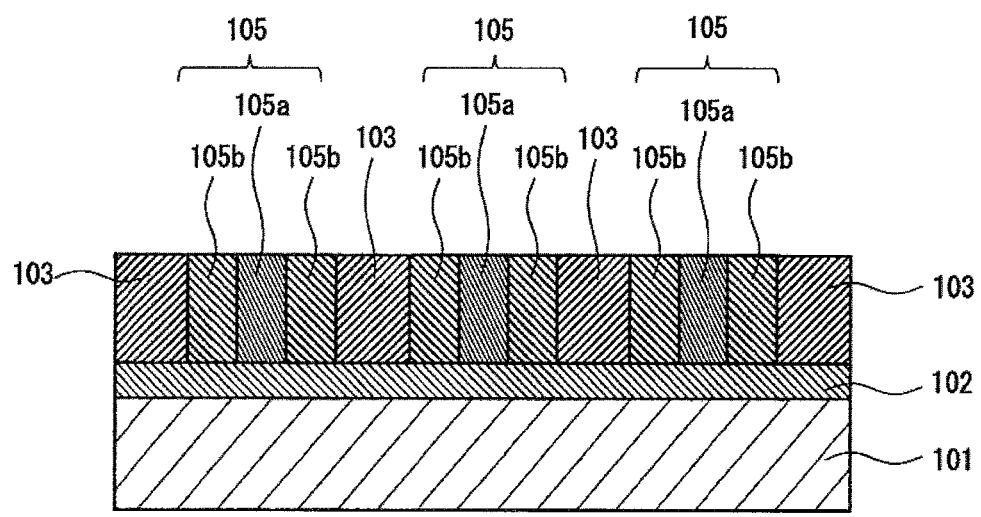
FIG. 6 is a schematic view showing, in the case of hole pattern formation, an exemplary state after a directed self-assembled film is formed in a region on the underlayer film sandwiched between the prepatterns in the pattern-forming method according to an embodiment of the present invention.

In this step, a directed self-assembled film having a phase separation structure is formed using the directed self-assembly composition for pattern formation according to the embodiment of the present invention. When the underlayer film and the prepattern are not employed, the directed self-assembly composition for pattern formation is coated directly onto the substrate to provide a coating film, whereby a directed self-assembled film with a phase separation structure is formed. On the other hand, when the underlayer film and the prepattern are employed, a coating film 104 is provided in a region on the underlayer film 102 sandwiched between the prepatterns 103 using the directed self-assembly composition for pattern formation, and a directed self-assembled film 105 having a phase separation structure with an interface substantially perpendicular to the substrate 101 is formed on the underlayer film 102 provided on the substrate 101, as shown in FIGS. 3 and 4 (in the case of line-and-space pattern formation), and FIG. 6 (in the case of hole pattern formation). During this process, by subjecting the directed self-assembly composition for pattern formation coated on the substrate to annealing or the like, polymers bearing a similar property are assembled to spontaneously form an ordered pattern, leading to formation of a directed self-assembled film having phase separation structures such as a sea-island structure, a cylindrical structure, a co-continuous structure, a lamella structure, or the like.

A structure having an interface substantially perpendicular to the substrate 101 is preferred as the phase separation structure. When the prepattern 103 is present, this phase separation structure is preferably formed along the prepattern 103, and more preferably the interface induced by the phase separation is substantially parallel to the lateral face of the prepattern 103. In the present pattern-forming method, a phase 105*b* of the first polymer is formed along the lateral face of the prepattern 103, and a phase 105*a* of the second polymer is formed so as to abut the phase 105*b*, as shown in FIG. 4. The phase separation structure induced in this step is made up of a plurality of phases, and typically, the interface formed between these phases is substantially perpendicular to the substrate 101; however, it is to be noted that the interface itself may not be well-defined. In the present pattern-forming method, since the directed self-assembly composition for pattern formation according to the embodiment of the present invention is used, the phase separation takes place more easily, and finer phase separation structures (microdomain structures) can be induced.

Examples of methods for coating the directed self-assembly composition for pattern formation onto the substrate 101 to provide the coating film 104 include, but not particularly limited to: a method in which the directed self-assembly composition for pattern formation employed is coated, for example, by means of a spin coating technique; and the like. By this procedure, the directed self-assembly composition for pattern formation is coated between the prepatterns 103 on the substrate 101 or on the underlayer film 102, to provide a coating film.

The annealing process may include, for example, heating at a temperature of 80° C. to 400° C. in an oven, on a hot plate, etc., and the like. The annealing time period is typically 10 sec to 30 min, and preferably 30 sec to 10 min. The film thickness of the directed self-assembled film 105 thereby obtained is preferably 0.1 nm to 500 nm, and more preferably 0.5 nm to 100 nm.

Removal Step

Figure 5:
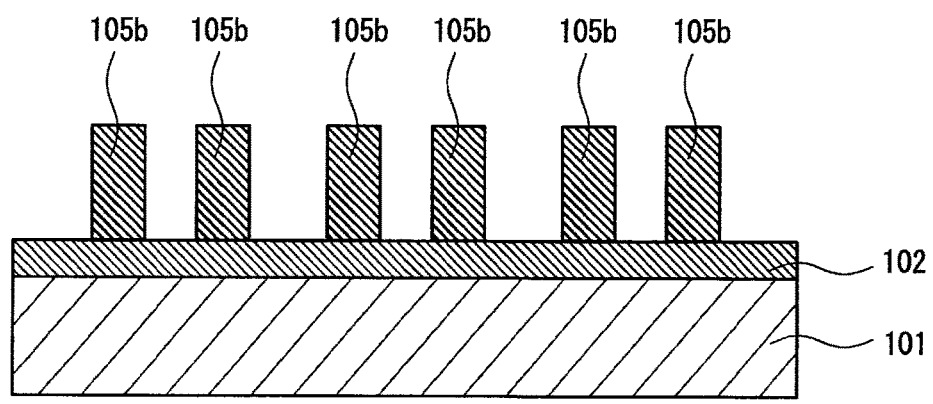
FIG. 5 is a schematic view showing, in the case of the line-and-space pattern formation, an exemplary state after a part of the phase of the directed self-assembled film and the prepatterns are removed in the pattern-forming method according to an embodiment of the present invention.
Figure 7:
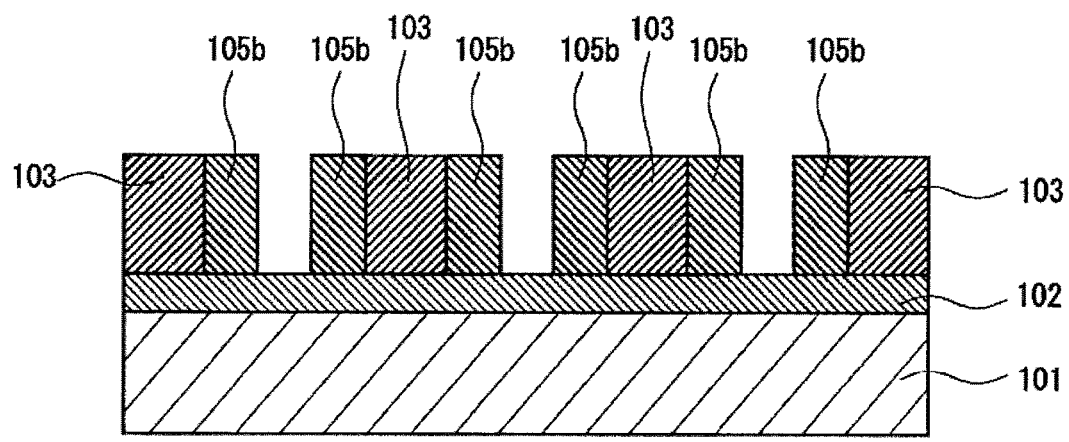
FIG. 7 is a schematic view showing, in the case of the hole pattern formation, an exemplary state after a part of the phase of the directed self-assembled film is removed in the pattern-forming method according to an embodiment of the present invention.

In this step, a part of the phase of the directed self-assembled film 105 is removed. This removal is conducted through an etching treatment by utilizing the difference in etching rate of each of phases 105a and 105b phase-separated through directed self-assembling. FIG. 5 (showing the case of line-and-space pattern formation) illustrates an exemplary state after the phase 105a of the phase separation structures and the prepattern 103 are removed. FIG. 7 (showing the case of hole pattern formation) illustrates an exemplary state after the phase 105a of the phase separation structure is removed.

Examples of methods for removing a part of the phase of the directed self-assembled film 105 through an etching treatment include well-known methods, for example: reactive ion etching (RIE) such as chemical dry etching and chemical wet etching (wet development); physical etching such as sputter etching and ion beam etching; and the like. Among these, for example, as a method for removing a phase made up of a styrene polymer, the reactive ion etching (RIE) is preferred, and chemical dry etching using $CF_4$, $O_2$ gas, and the like, as well as chemical wet etching using an organic solvent (such as methyl isobutyl ketone (MIBK), and 2-propanol (IPA)) or an etching solution such as hydrofluoric acid are more preferred.

In the chemical wet etching, when the phase made up of the styrene polymer is removed, for example, the following organic solvent may be used: hydrocarbons such as cyclohexane and cycloheptane; ketones such as methyl isobutyl ketone; alcohols such as 2-propanol; ethers such as tetrahydrofuran; and the like. Among these, the hydrocarbons and the ethers are preferred, hydrocarbons are more preferred, and cyclohexane is still more preferred.

Prepattern Removal Step

In this step, the prepattern is removed. In the case of the line-and-space pattern formation, it is preferred to remove the prepattern as shown in FIG. 5. In the case of the hole pattern formation, the removal of the prepattern is not needed as shown in FIG. 7. Examples of methods for removing the prepattern includes, but not particularly limited to: a method in which the prepattern is removed through an etching treatment by utilizing the difference in etching rate between the prepattern and the formed directed self-assembled film 105; and the like. This prepattern removal step may be conducted after the directed self-assembled film formation step, and in any stage, i.e., prior to, concurrently with or after the removal step.

Although a variety of patterns can be formed as described above, the pattern thus formed is preferably a line-and-space pattern or a hole pattern. Since the directed self-assembly composition for pattern formation as described above is used according to the present pattern-forming method, a desired finer line-and-space pattern or hole pattern can be formed.

Typically, after a part of the phase of the directed self-assembled film 105 is removed, patterning of the substrate 101 is carried out by etching the substrate 101 alone, or both of the underlayer film 102 and the substrate 101 by means of the pattern made up of the remaining phase as a mask. After completion of the patterning of the substrate 101, the phase used as the mask is removed from the substrate 101 by a solubilization treatment, or the like, and finally the patterned substrate can be obtained. As a method for the etching, methods similar to those used in the removal step may be employed, and the etching gas and etching solution may be selected appropriately in accordance with material entity of the underlayer film 102 and substrate 101. For example, when the substrate 101 is a silicon material, a mix gas of a flon gas and $SF_4$, or the like may be used. Further, when the substrate 101 is a metal film, a mix gas of $BCl_3$ and $Cl_2$, or the like may be used.

EXAMPLES

Hereinafter, the present invention will be explained more specifically by way of Examples, but the present invention is not limited to these Examples. Measuring methods for each physical property are shown below.

Weight Average Molecular Weight (Mw) and Number Average Molecular Weight (Mn)

The Mw and the Mn of the polymer were determined by gel permeation chromatography (GPC) using GPC columns manufactured by Tosoh Corporation ("G2000HXL"×2, "G3000HXL"×1, and "G4000HXL"×1) under the following conditions. In addition, the dispersity index (Mw/Mn) was derived from results of the determination of the Mw and Mn.

elution solvent: tetrahydrofuran (Wako Pure Chemical Industries, Ltd.)
flow rate: 1.0 mL/min
sample concentration: 1.0% by mass
amount of the sample injected: 100 µL
column temperature: 40° C.
standard substance: monodisperse polystyrene
detector: differential refractometer $^{13}$C-NMR Analysis $^{13}$C-NMR analysis was carried out using JNM-EX400 manufactured by JEOL, Ltd., and DMSO-$d_6$ as a measurement solvent. The content of each structural unit in the polymers was calculated based on the area ratio of the peaks assigned to each structural unit in a spectrum obtained by $^{13}$C-NMR analysis.

Synthesis of Polymer (A1)

Synthesis Example 1: Synthesis of Polymer (A1-1)

A 1-L flask reaction vessel was dried under reduced pressure and to this reaction vessel was charged under a nitrogen atmosphere 500 g of cyclohexane, which had been subjected to a distillation dehydrating treatment, and the reaction vessel was cooled to 0° C. Thereafter, 4.40 mL of n-butyllithium (cyclohexane solution: 1.8 mol/L) was charged, and then to this vessel was added dropwise over 30 min 40 g of styrene, which had been subjected to a distillation dehydrating treatment. After completion of the dropwise addition, the reaction mixture was incubated for 60 min, and then 1 g of 1,2-butylene oxide as an end processing agent was added, and the reaction was allowed to proceed. The reaction solution was warmed to room temperature and concentrated, and then propylene glycol monomethyl ether acetate (PGMEA) was added to compensate the removed portion. Thereafter, 1,000 g of a 2% by mass aqueous oxalic acid solution was charged, the mixture was stirred, and after settling down the mixture, the water layer (i.e., the underlayer) was removed. This operation was repeated three times to remove any lithium salt. Thereafter, 1,000 g of ultra pure water was charged and the mixture was stirred, and after settling down the mixture, the water layer (i.e., the underlayer) was removed. This operation was repeated three times, to remove any oxalic acid. Thereafter, the solution was concentrated, and the concentrated solution was added dropwise into 500 g of n-hexane to precipitate the polymer. The polymer was isolated by vacuum filtration and washed twice with n-hexane, and thereafter dried at 60° C. under reduced pressure to yield 10.5 g of a white polymer (A1-1). The polymer (A1-1) had an Mw of 5,000, and an Mw/Mn of 1.13.

Synthesis Examples 2 to 11: Synthesis of Polymers (A1-2) to (A1-10) and Polymer (a1-1)

The polymers (A1-2) to (A1-10) and the polymer (a1-1) were synthesized in a similar manner to Synthesis Example 1 except that the amount of n-butyllithium used and the type of the end processing agent were as specified in Table 1. The Mw and Mw/Mn of each polymer obtained are presented collectively in Table 1.

Here, the structural formulae of some end processing agents are listed below.

  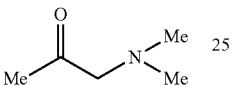

ethyl isocyanurate  ethyl isothiocyanurate  (1-dimethylamino)acetone

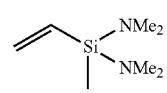

bis(dimethylamino)methylvinylsilane

Synthesis of Polymer (A2)

Monomer compounds (M-1) to (M-5) used in the synthesis of the polymer (A2) are listed below.

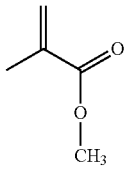

(M-1)

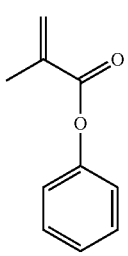

(M-2)

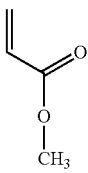

(M-3)

TABLE 1

|  | Polymer | Amount of n-butyllithium used (mL) | End processing agent | Mw | Mw/Mn |
|---|---|---|---|---|---|
| Synthesis Example 1 | A1-1 | 4.40 | 1,2-butylene oxide | 5,000 | 1.13 |
| Synthesis Example 2 | A1-2 | 1.50 | 1,2-butylene oxide | 15,100 | 1.09 |
| Synthesis Example 3 | A1-3 | 0.27 | 1,2-butylene oxide | 80,600 | 1.15 |
| Synthesis Example 4 | A1-4 | 0.49 | butyl glycidyl ether | 45,200 | 1.14 |
| Synthesis Example 5 | A1-5 | 1.00 | propylene oxide | 21,100 | 1.08 |
| Synthesis Example 6 | A1-6 | 4.40 | ethyl isocyanurate | 5,100 | 1.09 |
| Synthesis Example 7 | A1-7 | 4.40 | (1-dimethylamino)acetone | 5,000 | 1.10 |
| Synthesis Example 8 | A1-8 | 4.40 | carbon dioxide | 5,200 | 1.11 |
| Synthesis Example 9 | A1-9 | 4.40 | ethyl isothiocyanate | 4,900 | 1.09 |
| Synthesis Example 10 | A1-10 | 4.40 | bis(dimethylamino)methylvinylsilane | 5,000 | 1.11 |
| Synthesis Example 11 | a1-1 | 0.75 | methanol | 35,300 | 1.10 |

(M-4)

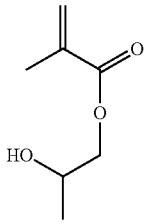

(M-5)

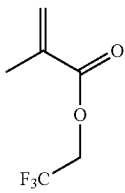

Synthesis Example 12: Synthesis of Polymer (A2-1)

To 10 g of 2-butanone heated to 80° C. was added dropwise 20 g of 2-butanone containing 10 g of methyl methacrylate (monomer compound (M-1)) and 2 g of dimethyl 2,2'-azobis(isobutyrate) over 3 hrs. Thereafter, the mixture was heated at 80° C. for 3 hrs and concentrated, and then the concentrated mixture was added dropwise into 200 g of n-hexane to precipitate the polymer. The precipitated polymer was vacuum filtered, washed twice with n-hexane, and dried at 60° C. under reduced pressure to yield 8 g of a white polymer (A2-1). The polymer (A2-1) had an Mw of 5,400 and an Mw/Mn of 1.3.

Synthesis Examples 13 to 17: Synthesis of Polymers (A2-2) to (A2-6)

The polymers (A2-2) to (A2-6) were synthesized in a similar manner to Synthesis Example 12 except that the type and amount of the monomer compounds used were as specified in Table 2. In these syntheses, the total mass of the monomer compounds used was 10 g. The Mw and Mw/Mn of each polymer obtained are presented collectively in Table 2.

TABLE 2

| | Polymer type | Monomer compound type | Monomer compound amount used (mol %) | Content of structural unit derived from each monomer compound (mol %) | Mw | Mw/Mn |
|---|---|---|---|---|---|---|
| Synthesis Example 12 | A2-1 | M-1 | 100 | 100 | 5,400 | 1.3 |
| Synthesis Example 13 | A2-2 | M-2 | 100 | 100 | 5,200 | 1.3 |
| Synthesis Example 14 | A2-3 | M-3 | 100 | 100 | 5,300 | 1.4 |
| Synthesis Example 15 | A2-4 | M-4 | 100 | 100 | 5,300 | 1.3 |
| Synthesis Example 16 | A2-5 | M-5 | 100 | 100 | 5,100 | 1.4 |
| Synthesis Example 17 | A2-6 | M-1/M-2 | 50/50 | 50/50 | 5,200 | 1.3 |

Preparation of Directed Self-assembly Composition for Pattern Formation

The solvent (B) used in the preparation of the directed self-assembly composition for pattern formation is listed below.

(B) Solvent

B-1: Propylene Glycol Monomethyl Ether Acetate (PGMEA)

Example 1

The polymers (A1-1) and (A2-1) as the polymer component (A) were mixed in a mass ratio of 7:3, and the mixture was charged into the solvent (B-1) as the solvent (B) so as to give the concentration of the polymer component (A) of 1% by mass to prepare a solution. This solution was filtered through a membrane filter with a pore size of 200 nm to prepare the directed self-assembly composition for pattern formation according to Example 1.

Examples 2 to 15 and Comparative Example 1

Each directed self-assembly composition for pattern formation was prepared in a similar manner to Example 1 except that the type and amount of each blended component were as specified in Table 3.

Pattern Formation

An underlayer film with a film thickness of 77 nm was provided on a 12-inch silicon wafer, i.e., a substrate, by spin coating an underlayer film-providing composition (ARC66, manufactured by Brewer Science) on the 12-inch silicon wafer with a coating/development apparatus (CLEAN TRACK ACT12, manufactured by Tokyo Electron Limited), and thereafter subjecting the same to baking at 205° C. Next, a resist film with a film thickness of 60 nm was provided on the underlayer film by spin coating an ArF resist manufactured by JSR on the underlayer film, and thereafter subjecting the same to prebaking (PB) at 120° C. for 60 sec. Next, the coating film was exposed using an ArF Immersion Scanner (NSR S610C, manufactured by Nikon Corporation) through a mask pattern, under the optical condition involving NA of 1.30, CrossPole, and σ of 0.977/0.78. Thereafter, the resist film was subjected to PEB at 115° C. for 60 sec, and developed with a 2.38% by mass aqueous tetramethylammonium hydroxide solution at 23° C. for 30 sec, followed by rinsing with water, and drying to form a prepattern (hole having a diameter of 60 nm with a pitch of 120 nm). Next, the prepattern was irradiated with a 254 nm ultraviolet ray at 150 mJ/cm², and subjected to baking at 170° C. for 5 min, to yield a substrate to be evaluated.

Next, each directed self-assembly composition for pattern formation was coated onto the substrate to be evaluated so as give a thickness of 15 nm, and annealed at 120° C. for 1 min to allow phase separation to occur and a microdomain structure to be formed. Thereafter, the annealed composition was immersed in cyclohexane for 1 min to remove the polystyrene portion, whereby a hole pattern was formed.

Evaluation

The following evaluation was conducted for each hole pattern formed as described above. The results are collectively shown in Table 3.

Shrinkage Amount

Each hole pattern was observed using a line-width measurement SEM (S9380, manufactured by Hitachi High-Technologies Corporation), and a value was calculated by subtracting the diameter of the hole pattern obtained (nm) from the diameter of the hole of the prepattern (nm), and this value was defined as the shrinkage amount (nm). The shrinkage amount of no less than 10 nm may be evaluated to be "favorable", while the shrinkage amount of less than 10 nm may be evaluated to be "unfavorable".

TABLE 3

| | (A) Component | | | | |
|---|---|---|---|---|---|
| | type | amount blended (parts by mass) | type | amount blended (parts by mass) | (B) Solvent | Shrinkage amount (nm) |
| Example 1 | A1-1 | 70 | A2-1 | 30 | B-1 | 20 |
| Example 2 | A1-1 | 70 | A2-2 | 30 | B-1 | 19 |
| Example 3 | A1-1 | 70 | A2-3 | 30 | B-1 | 17 |
| Example 4 | A1-1 | 70 | A2-4 | 30 | B-1 | 19 |
| Example 5 | A1-1 | 70 | A2-5 | 30 | B-1 | 20 |
| Example 6 | A1-1 | 70 | A2-6 | 30 | B-1 | 16 |
| Example 7 | A1-2 | 70 | A2-1 | 30 | B-1 | 20 |
| Example 8 | A1-3 | 70 | A2-1 | 30 | B-1 | 19 |
| Example 9 | A1-4 | 70 | A2-1 | 30 | B-1 | 18 |
| Example 10 | A1-5 | 70 | A2-1 | 30 | B-1 | 17 |
| Example 11 | A1-6 | 70 | A2-1 | 30 | B-1 | 15 |
| Example 12 | A1-7 | 70 | A2-1 | 30 | B-1 | 17 |
| Example 13 | A1-8 | 70 | A2-1 | 30 | B-1 | 16 |
| Example 14 | A1-9 | 70 | A2-1 | 30 | B-1 | 18 |
| Example 15 | A1-10 | 70 | A2-1 | 30 | B-1 | 17 |
| Comparative Example 1 | a1-1 | 70 | A2-1 | 30 | B-1 | 9 |

As is seen from the results shown in Table 3, when each directed self-assembly composition for pattern formation according to the above Examples was used, the shrinkage amount was favorable in all cases, while the shrinkage amount for the directed self-assembly composition for pattern formation according to the Comparative Example was unfavorable. This result clearly demonstrates that the directed self-assembly compositions for pattern formation according to the above Examples allow for smaller hole pattern diameters compared to that for Comparative Example, leading to formation of sufficiently fine microdomain structures.

The embodiment of the present invention can provide a directed self-assembly composition for pattern formation enabling a sufficiently fine pattern size and/or pitch size to be formed, and a pattern-forming method using the same. Therefore, the present pattern-forming method can be suitably used in lithography processes in manufacture of various types of electronic devices such as semiconductor devices, liquid crystal devices and optical devices, and the like for which further microfabrication has been demanded.

Obviously, numerous modifications and variations of the present invention are possible in light of the above teachings. It is therefore to be understood that within the scope of the appended claims, the invention may be practiced otherwise than as specifically described herein.

What is claimed is:

1. A directed self-assembly composition, comprising:
   two or more kinds of polymers each not having a silicon atom in a main chain thereof,
   wherein at least one of the two or more kinds of polymers has a group binding to the polymerizing end of the main chain and having a hetero atom, and the group is introduced by reacting a hetero-atom containing end processing agent with an active end of the main chain of the at least one of the two or more kinds of polymers,
   wherein the two or more kinds of polymers comprise a styrene homopolymer and an acrylate ester copolymer, wherein the group comprises —OH or —NR$_2$, wherein each R independently represents a hydrogen atom, a halogen atom or a monovalent organic group having 1 to 30 carbon atoms, and
   wherein the styrene homopolymer comprises the group.

2. The directed self-assembly composition according to claim 1, wherein the group is represented by formula (1):

$$—R^1—OH \qquad (1)$$

wherein, in the formula (1), R$^1$ represents a divalent organic group having 1 to 30 carbon atoms.

3. The directed self-assembly composition according to claim 2, wherein the group represented by the formula (1) is derived from an epoxy compound.

4. A pattern-forming method, comprising:
   forming a directed self-assembled film having a phase separation structure which comprises a plurality of phases, using the directed self-assembly composition according to claim 1; and
   removing a part of the plurality phases of the directed self-assembled film to form a pattern.

5. The pattern-forming method according to claim 4, further comprising,
   prior to forming the directed self-assembled film:
      providing an underlayer film on a substrate; and
      forming a prepattern on the underlayer film, and
   after forming the directed self-assembled film:
      removing the prepattern,
   wherein in forming the directed self-assembled film, the directed self-assembled film is formed in a region on the underlayer film segregated by the prepattern.

6. The pattern-forming method according to claim 4, wherein the pattern formed is a line-and-space pattern or a hole pattern.

7. A directed self-assembly composition, comprising:
   two or more kinds of polymers each not having a silicon atom in a main chain thereof,
   wherein at least one of the two or more kinds of polymers has a group binding to the polymerizing end of the main chain and having a hetero atom, and the group is introduced by reacting a hetero-atom containing end processing agent with an active end of the main chain of the at least one of the two or more kinds of polymers,
   wherein the two or more kinds of polymers comprise a styrene homopolymer and an acrylate ester copolymer,
   wherein the hetero atom is a sulfur atom, a phosphorus atom, a silicon atom, a tin atom or a combination thereof, and
   wherein the styrene homopolymer comprises the group.

8. A pattern-forming method, comprising:
   forming a directed self-assembled film having a phase separation structure which comprises a plurality of phases, using the directed self-assembly composition according to claim 7; and
   removing a part of the plurality phases of the directed self-assembled film to form a pattern.

9. The pattern-forming method according to claim 8, further comprising,
   prior to forming the directed self-assembled film:
      providing an underlayer film on a substrate; and
      forming a prepattern on the underlayer film, and
   after forming the directed self-assembled film:
      removing the prepattern,
   wherein in forming the directed self-assembled film, the directed self-assembled film is formed in a region on the underlayer film segregated by the prepattern.

10. The pattern-forming method according to claim 8, wherein the pattern formed is a line-and-space pattern or a hole pattern.

11. A directed self-assembly composition, comprising:
two or more kinds of polymers each not having a silicon atom in a main chain thereof,
wherein at least one of the two or more kinds of polymers has a group binding to the polymerizing end of the main chain and having hetero atoms, and the group is introduced by reacting a hetero-atom containing end processing agent with an active end of the main chain of the at least one of the two or more kinds of polymers,
wherein the two or more kinds of polymers comprise a styrene homopolymer and an acrylate ester copolymer, and
wherein the hetero atoms are at least two atoms selected from the group consisting of an oxygen atom, a nitrogen atom, a sulfur atom, a phosphorus atom, a silicon atom, and a tin atom, and
wherein the styrene homopolymer comprises the group.

12. A pattern-forming method, comprising:
forming a directed self-assembled film having a phase separation structure which comprises a plurality of phases, using the directed self-assembly composition according to claim 11; and
removing a part of the plurality phases of the directed self-assembled film to form a pattern.

13. The pattern-forming method according to claim 12, further comprising,
prior to forming the directed self-assembled film:
providing an underlayer film on a substrate; and
forming a prepattern on the underlayer film, and
after forming the directed self-assembled film:
removing the prepattern,
wherein in forming the directed self-assembled film, the directed self-assembled film is formed in a region on the underlayer film segregated by the prepattern.

14. The pattern-forming method according to claim 12, wherein the pattern formed is a line-and-space pattern or a hole pattern.

15. A directed self-assembly composition, comprising:
two or more kinds of polymers each not having a silicon atom in a main chain thereof,
wherein at least one of the two or more kinds of polymers has a group binding to the polymerizing end of the main chain and represented by formula (1-16), formula (1-29) or formula (1-32), and the group is introduced by reacting a hetero-atom containing end processing agent with an active end of the main chain of the at least one of the two or more kinds of polymers:

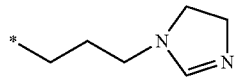

(1-16)

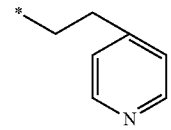

(1-29)

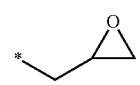

(1-32)

wherein * denotes a binding site to the polymerizing end of the main chain of the polymer, and
wherein the two or more kinds of polymers comprise a styrene homopolymer and an acrylate ester copolymer, and
wherein the styrene homopolymer comprises the group.

16. A pattern-forming method, comprising:
forming a directed self-assembled film having a phase separation structure which comprises a plurality of phases, using the directed self-assembly composition according to claim 15; and
removing a part of the plurality phases of the directed self-assembled film to form a pattern.

17. The pattern-forming method according to claim 16, further comprising,
prior to forming the directed self-assembled film:
providing an underlayer film on a substrate; and
forming a prepattern on the underlayer film, and
after forming the directed self-assembled film:
removing the prepattern,
wherein in forming the directed self-assembled film, the directed self-assembled film is formed in a region on the underlayer film segregated by the prepattern.

18. The pattern-forming method according to claim 16, wherein the pattern formed is a line-and-space pattern or a hole pattern.

* * * * *